United States Patent [19]
Hao et al.

[11] Patent Number: 6,077,744
[45] Date of Patent: Jun. 20, 2000

[54] SEMICONDUCTOR TRENCH MOS DEVICES

[75] Inventors: Jifa Hao, White Haven; Thomas Eugene Grebs, Mountaintop, both of Pa.

[73] Assignee: Intersil Corporation, Palm Bay, Fla.

[21] Appl. No.: 09/255,092

[22] Filed: Feb. 22, 1999

[51] Int. Cl.[7] .................... H01L 21/336; H01L 21/3205
[52] U.S. Cl. .................. 438/268; 438/270; 438/272; 438/589
[58] Field of Search .................... 438/268, 270, 438/272, 589

[56] References Cited

U.S. PATENT DOCUMENTS

| | | | |
|---|---|---|---|
| 5,733,810 | 3/1998 | Baba et al. | 438/268 |
| 5,770,514 | 6/1998 | Matsuda et al. | 438/589 |
| 5,918,114 | 6/1999 | Choi et al. | 438/270 |

*Primary Examiner*—David Nelms
*Assistant Examiner*—Michael S Lebentritt
*Attorney, Agent, or Firm*—Jaeckle Fleischmann & Mugel, LLP

[57] ABSTRACT

In a semiconductor device, a trench is etched into a surface of a semiconductor body comprising, from the surface down, a highly doped first (source) region; a moderately doped second (body) region; and a lightly doped third (drain) region. The trench walls are then oxidized. For reducing the effects of etching rate and oxide growing rate variations which occur at the junctions between regions of differing concentrations, the trench is first formed by etching and the trench walls then oxidized prior to the formation of the first region. Trenches having straighter walls and more uniformly thick oxides are thus formed.

7 Claims, 7 Drawing Sheets

SEMICONDUCTOR TRENCH MOS DEVICES

BACKGROUND OF THE INVENTION

This invention relates to the manufacture of semiconductor devices including MOS transistor components disposed along the side walls of trenches formed on an "upper" surface of a semiconductor chip.

For increasing the density of semiconductor device components per surface area of semiconductor chips, a recent practice has been to form narrow trenches on a surface of the chips and to dispose MOS transistor components in vertical orientation along the trench walls. Thus, while surface area of the chips is taken up by the trenches, the surface area lost to the trenches is more than made up by the surface areas of the vertical walls of the trenches.

A typical MOS transistor component (forming part of semiconductor devices such as insulated bipolar transistors, MOS controlled thyristors, and MOS transistors) comprises source and drain regions of the same conductivity type separated by a channel region of opposite type conductivity. Conduction of charge carriers from the source region to the drain region through the channel region is controlled by a voltage applied to a gate electrode overlying the channel region and separated therefrom by a thin layer of a dielectric material. With chips of silicon, the dielectric material is typically silicon dioxide.

In the manufacture of such trench devices, and particularly semiconductor devices used in power controlling applications, a starting workpiece comprises a silicon chip comprising an "underlying" substrate of relatively heavily doped silicon, e.g., of N type, an intermediate silicon layer interfacing with the substrate and, in this example, lightly doped N type, and an overlying silicon layer "moderately" doped, of P type. In the completed device, the intermediate layer and substrate comprise a drain region common to a plurality of MOS components (connected in parallel within a single or "discrete" power device), and the overlying layer comprises the channel region of each of the MOS components. Completion of the workpiece requires the addition of a source region, a gate oxide, and source and gate electrodes for each MOS component as well as a drain electrode for the common drain region. This is accomplished by first forming spaced apart regions of N type conductivity across the upper surface of the chip, e.g., by ion implantation. The N type regions extend only part way through the overlying P type layer and are to comprise the source regions of the MOS components. Significantly, because the spaced apart source regions are provided in a uniformly doped layer, i.e., without defined features, little precision is required in the process.

With the source regions in place, trenches are then etched entirely through the overlying P layer through each of the source regions. Great precision is required, but the previously formed source regions are clearly visible and provide a means for precise alignment of the photomask used in the trench etching process. With the trenches in place, thus exposing vertical surfaces which extend through the source regions, the underlying P type layer and a portion of the N type intermediate layer, the trench walls are coated, e.g., in a thermal oxidation process, with a layer of silicon dioxide. The trenches are then filled with an electrically conductive material, e.g., doped polycrystalline silicon, which serves as the gate electrode of the MOS components formed vertically along the trench walls. The silicon dioxide layers covering the trench walls serve as the gate electrode dielectric layer of the various MOS components as well as an insulator at the bottoms of the trenches for electrically isolating the gate electrodes from the underlying drain regions.

For completing all the MOS components, electrically conductive layers are provided on the chip surfaces serving as source and drain region electrodes and extensions of the gate electrodes.

Preferably, for high packing density of the MOS components on the chip, all the elements added to the initial chip workpiece are as small as possible, e.g., the trenches have the smallest widths achievable using known etching processes. Also, for desirable electrical characteristics, the gate oxide layers are uniformly thin. Two basic problems are found to exist with the known manufacturing processes. One is that the trench walls are not uniformly straight and smooth, and the second is that the gate oxide layers are not uniformly thick. The effect of such structural variations is variations in electrical characteristics of the various MOS components. Ideally, all the MOS components should have identical shapes and dimensions and identical electrical characteristics. The present invention is directed toward reducing the structural variations among the MOS components and improving the uniformity of the electrical characteristics thereof.

SUMMARY OF THE INVENTION

In accordance with the invention, it was recognized that the rates at which etching of the trenches and oxidizing of the trench walls occur are functions of the doping (type and concentration) of the silicon material through which the trenches extend. Thus, at each of the interfaces between the source regions and the chip upper layer and between the chip upper layer and the intermediate layer, processing rate variations occur resulting in changes in the slope of the trench walls being etched and in the thickness of the gate oxide layers being grown. Significantly, it was discovered that the greatest processing variations occur at the interfaces between the heavily doped source regions (e.g., of N type) and the moderately doped (e.g., of P type) chip upper layer. In reliance upon this discovery, various processes are used wherein the chip trenches are formed and the trench walls are oxidized prior to the addition of the source regions to the chip. Accordingly, rather than aligning the various trenches to the previously formed source regions, as in the prior art, the source regions are aligned with the trenches. Details of how this is accomplished are described hereinafter.

DESCRIPTION OF THE DRAWING

The drawings are schematic and not to scale. All the figures are side sections taken through an upper portion of a semiconductor chip workpiece and showing but one of a plurality of trenches and associated MOS components simultaneously formed on the workpiece.

DESCRIPTION OF PREFERRED EMBODIMENTS

For ease of understanding of the invention, a known prior art process for fabricating MOS components of the "trench" type is first described. The known process is illustrated in FIGS. 1–6. The semiconductor device being fabricated is a known power MOS transistor.

Figure 1:
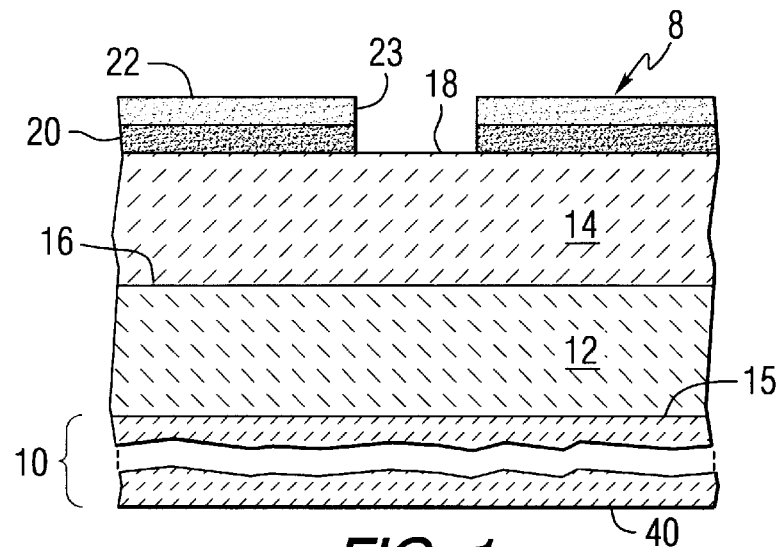
FIGS. 1–6 show a sequence of processing steps used according to the prior art.

FIG. 1 shows a starting workpiece 8 comprising a semiconductor wafer including an underlying substrate 10, in this illustrative example, heavily doped silicon of N type conductivity. Typically, the substrate 10 has a thickness of around 0.025 inch and is cut from a grown single crystal of silicon. Overlying the substrate 10 is an intermediate layer 12, having a thickness of up to around 100 microns, overlaid by an upper layer 14 having a thickness of around 2 microns. The thickness dimensions are given to provide an indication of typical relative dimensions; the actual thickness can vary depending upon the actual devices being made and the processing techniques used.

In the present illustration, the intermediate layer 12 is epitaxially grown on a surface 15 of the substrate 10, and the upper layer 14 is formed by implantation and diffusion of ions into an upper portion of the intermediate layer 12. In this illustration, the substrate 10 is heavily doped (N$^+$) by arsenic or antimony ions at a concentration in a range of around $10^{19}$ to $10^{20}/cm^3$. The intermediate layer 12 is lightly doped (N$^-$) by arsenic ions at a concentration in a range of around $10^{14}$ to $10^{16}/cm^3$. The top layer 14 is moderately P doped, by boron ions, at a concentration in a range of around $10^{15}$ to $10^{17}/cm^3$.

As with the illustrative thickness dimensions, the illustrative doping concentrations indicate typical relative conductivities which can vary dependant upon the devices being made.

FIG. 1 shows but one small portion (e.g., having a lateral dimension of around 2 microns) of a generally circular wafer having a diameter of around 6 inches. After completion of various manufacturing processes, the wafer is diced into a plurality of chips, each chip containing a plurality of portions such as the one shown in FIG. 1 plus other portions including terminals and the like for each chip.

FIG. 1 illustrates the workpiece at the conclusion of a photolithographic process sequence where a surface portion 18 of the layer 14 has been exposed through an opening 23 through a surface dielectric layer 20 (typically, thermally grown silicon dioxide) covered by a photolithographically patterned photoresist layer 22. (FIG. 1 shows, as described, an underlying silicon substrate 10. In all other figures, the substrate 10, while still present, is not illustrated.)

Figure 2:
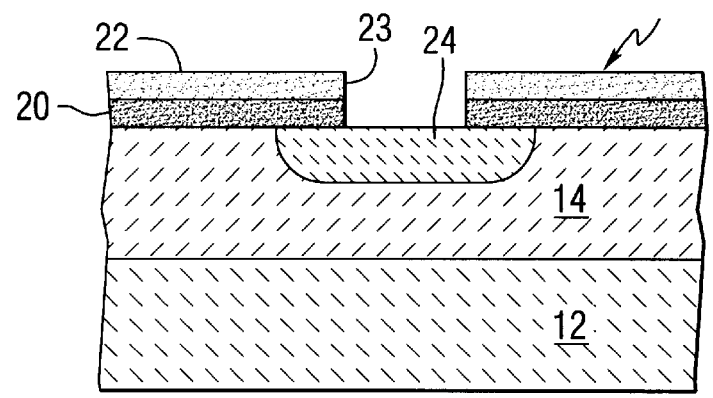

FIG. 2 shows a following process step where N type dopants, e.g., phosphorous or arsenic, are first ion implanted (at a concentration of around $10^{16}/cm^2$ and an energy of around 120 KeV) into the P type layer 14 through the opening 23 and then caused to diffuse laterally and downwardly in a diffusion (heating) process. Resulting is a heavily doped N$^+$ doped region 24, e.g., at a concentration of around $10^{19}$ to $10^{21}/cm^3$ and of circular shape at the layer surface. In the completed chip, the region 24 is to form a source region of an MOS transistor. In following steps, other portions of the transistor are made precisely located relative to the source region 24.

Figure 3:
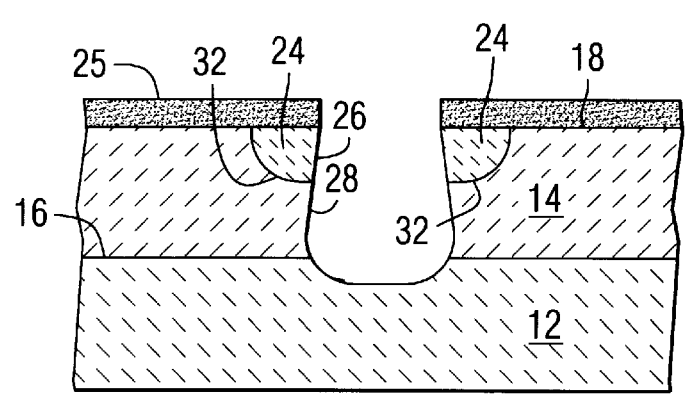

Thus, in a series of processing steps only the result of which is shown in FIG. 3, a photolithographically patterned oxide layer 25 is used as an etch mask for etching a trench 26, by reactive ion etching (RIE), precisely positioned relative to the source region 24. Typically, although not critical, the surface 18 of the P type layer 14 lies in the 100 crystal plane, and the vertical walls 28 of the trench are "intended to" lie in the 110 plane which, in the silicon crystal, is precisely perpendicular to the surface plane. Herein lies a problem of the prior art process. As shown in FIG. 3, the etched trench 26 extends entirely through the N$^+$ source region 24, entirely through the P layer 14, and partly into the N layer 12. It is known, however, that the rate of etching of silicon is a function both of the dopants present (typically phosphorous N dopant and boron P dopant) and the concentration of the dopants in the silicon. Thus, because the rate of etching varies as the differently doped regions are encountered, variations in the slope of the trench walls occurs. This is illustrated, somewhat exaggerated, in FIG. 3. Significantly, the degree of slope variation is somewhat random and the actual trench shapes vary from trench to trench. Such variable trench profiles give rise to undesirable random variations in transistor electrical characteristics.

In the prior art device described herein, the doping concentration in the region 24 is around four orders of magnitude greater than the doping concentration in the layer 14 ($10^{19}$ versus $10^{15}$ at the low ends of the respective doping ranges and $10^{21}$ versus $10^{17}$ at the high ends thereof) Such (around) four orders of magnitude difference in doping concentration is generally sufficient to cause undesirably large etching rate variations.

With the trench 26 in place, the walls of the trench are then oxidized, typically in a thermal oxidation process, to provide (FIG. 4) a thin (e.g., 300–1,000 A) silicon dioxide layer 30. A problem, however, similar to that of etching the trench 26, is that the rate of oxidation of the silicon walls of the trench is a function of the dopants present and the concentration of the dopants. Thus, at the junction 32 between the N$^+$ source region 24 and the P layer 14, the rate of oxidation varies, with the result being, as shown exaggerated in FIG. 4, that the thickness of the oxide layer 30 varies over a significant length of the layer 14 beginning at the junction 32. The thickness of the oxide layer 30 is critical with respect to transistor characteristics, and even quite small thickness variations from trench to trench result in significant variations in electrical characteristics of the various transistors. (Some variation in the rate of growth of the oxide layer 30 also occurs at the junction 16 between the P top layer 14 and the N$^-$ intermediate layer 12. However, the doping concentrations in these two layers 14 and 12 are relatively close, hence the variation in the rate of oxidation at the junction 16 therebetween is relatively small.)

With the gate oxide layer 30 in place, the trench is then filled (FIG. 5) with a conductive material 34, typically doped polycrystalline silicon. While not illustrated, the trench filling process comprises (as known) depositing polycrystalline silicon over the entire surface of the workpiece and then removing the unwanted polysilicon from everywhere over the portion of the workpiece shown except from within the trench using a known "planarization" process. The polysilicon material remaining in the trench 26 serves as a gate electrode in the completed device.

Figure 5:
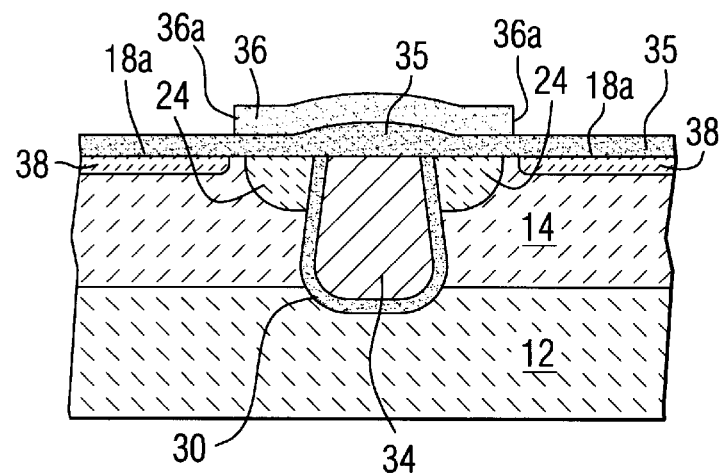
Figure 6:
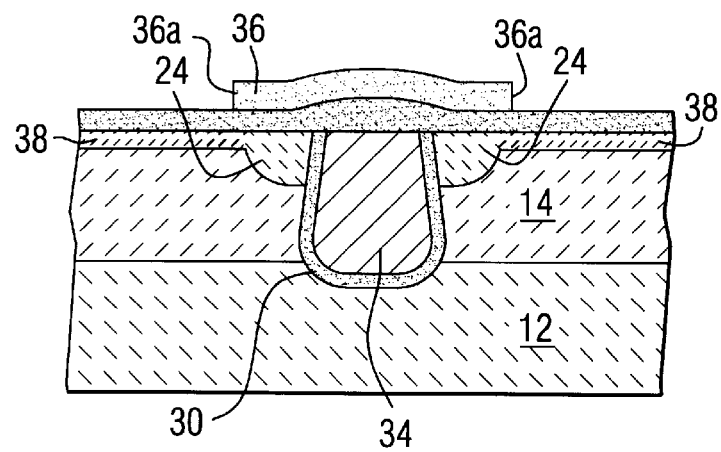

In final steps, shown in FIGS. 5 and 6, the entire upper surface of the workpiece (all of which, including the polysilicon gate electrode 34, is covered with an oxide layer 35) is covered with a photoresist layer 36 which is patterned to expose an oxide covered surface portion 18a of the P layer 14 surrounding the source region 24. The surface portion 18a is spaced slightly away from the source region 24 by an edge 36a of the patterned masking layer 36. P type ions are then implanted through the exposed oxide layer and into the underlying surface portions 18a of the P type layer 14 for providing a P$^+$ type region 38 at the surface 18a of the layer 14 which, after drive-in, as shown in FIG. 6, extends laterally beneath the edge 36a of the photoresist layer 36 and into electrical contact with the N source region 24.

The trench structure shown in FIG. 6 is but one of a plurality of identical side-by-side trench structures disposed at the surface of the chip. The side edges of the chip portion illustrated are shown broken. If FIG. 6 were extended, e.g., to the right, the P+ region 38 shown would extend into contact with a source region 24 of a trench structure identical to the structure shown in FIG. 6.

In subsequent steps, not illustrated, various electrically conductive layers are deposited on the workpiece for providing, as known, electrode connections to (and shorting together) the doped regions 24 and 38, the bottom surface 40 (FIG. 1) of the substrate 10, and the gate electrode 34. In power semiconductor devices, all the transistors on the chip are connected in parallel.

As mentioned, problems with the prior art process illustrated in FIGS. 1–6 are variations in the trench etching process and in the gate oxide forming process. Such processing variations are largely avoided in accordance with the present invention, as now described.

Figure 7:
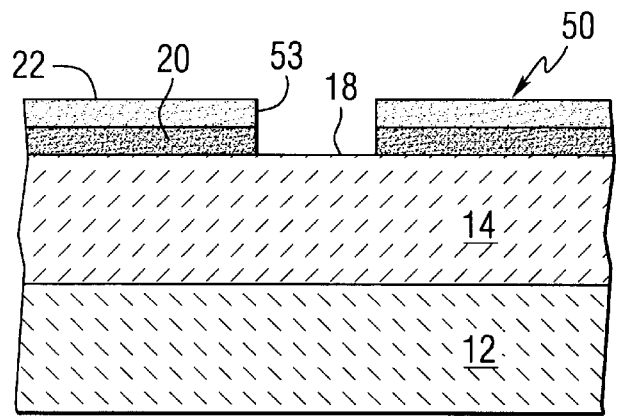
FIGS. 7–13, 15–18 and 19–24 show sequences of process steps used according to respective embodiments of the invention.
Figure 8:
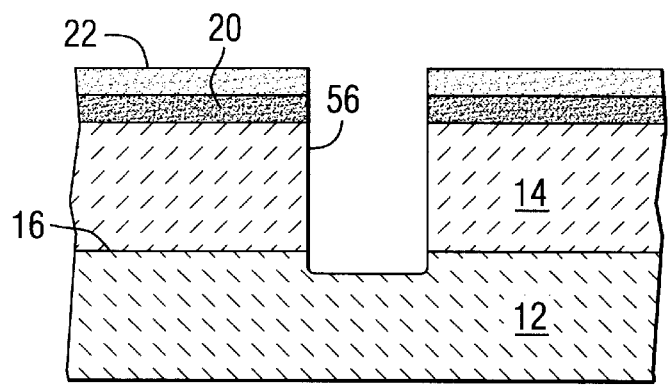

FIG. 7 shows a workpiece 50 at a processing stage similar to that of the workpiece 8 shown in FIG. 1. (Except where otherwise indicated, the workpiece 50 can be identical to the prior art workpiece 8 and like reference numerals are used for like structural details.) The FIG. 7 workpiece 50 comprises an N⁻ type layer 12 (overlying an N+ silicon substrate, not shown), a P type layer 14, and patterned dielectric (20) and photoresist (22) layers having an opening 53 therethrough. In this embodiment, the layer 20 is a thermally grown or a deposited (e.g., by CVD) oxide. In the FIG. 1 workpiece, the etched opening 23 through the two layers 22 and 20 is for the purpose of admitting dopant ions for the source region 24 (FIG. 2). In FIG. 7, the opening 53 is not for the formation of the source region but, rather, as shown in FIG. 8, the etching of a trench 56. The process of etching the trench 56 shown in FIG. 8 can be exactly the same as the etching of the trench 26 in FIG. 3 except that, and significantly, at the time of the etching process, a source region is not present and the etching occurs only through the P layer 14 and into the N⁻ layer 12. Because an N+ source region is not present in the P layer 14, the etching (RIE) proceeds at a uniform rate through the uniformly doped P layer 14 and the side walls of the trench 56 are quite straight and smooth. When the trench being etched reaches the junction 16 between the P layer 14 and the N⁻ layer 12, some variation in the etch rate occurs, but in a manner somewhat unexpected from an examination of FIG. 3. That is, rather than the rather large wall slope variations from the vertical present adjacent to the p-n junction 16 in FIG. 3, only quite small slope variations are present in FIG. 8.

The reason for this, we discovered, is that as variations from the vertical occur as the etching process reaches the p-n junction 32 in FIG. 3, the slope variations thus produced serve as local etch masks which tend to replicate and even increase the slope variations as the etching proceeds—even though the etching is through uniformly doped silicon. Thus, when, in FIG. 3, the p-n junction 16 is reached, any slope variations introduced by the presence of the junction 16 are actually relatively small in comparison with the variations already in place resulting from the presence of the overlying junction 32. [As previously noted, relatively large etching rate variations occur at the junction 32 (FIG. 3) owing to the relatively large (e.g., around four orders of magnitude) differences in doping concentration in the two regions 24 and 14. At the junction 16 between the regions 12 and 14 (FIGS. 3 and 8), a much smaller (e.g., around one order of magnitude) difference in doping concentrations exists, hence relatively small etching rate variations occur.]

Thus, upon examining enlarged photographs of trenches similar to the trench shown in FIG. 3, we recognized that the large slope variations present at the junction 16 are primarily not the inherent result of the presence of the junction 16 itself. Accordingly, and in accordance with the present invention, by eliminating the junction 32 and the large effects thereof during trench etching, the slope variations caused by the p-n junction 16 by itself are quite small, and trenches having relatively straight and smooth walls are produced as shown in FIG. 8. Based upon mere examination of FIG. 3, such major improvements are not expected.

Figure 4:
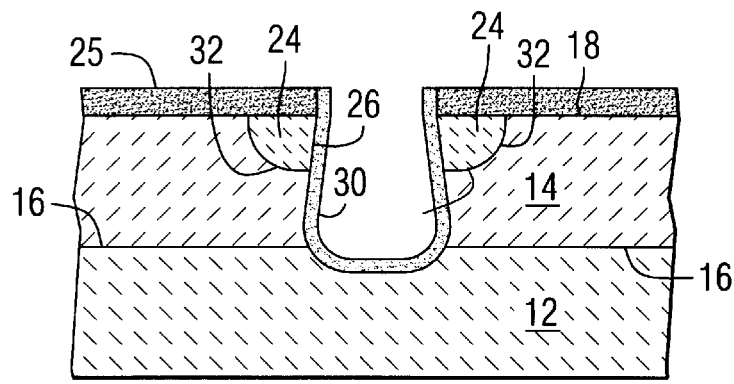
Figure 9:
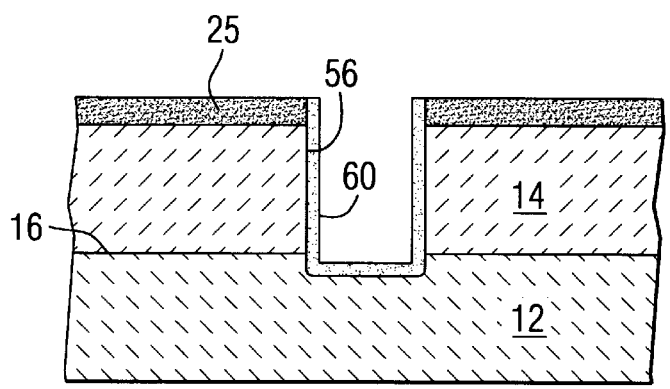

With the trench in place and with relatively straight and smooth walls, as shown in FIG. 8, the walls of the trench are then coated (FIG. 9) with a dielectric material, preferably a layer 60 of silicon dioxide provided in a known thermal oxidizing process. The workpiece shown in FIG. 9 is similar to the workpiece shown in FIG. 4 but with two exceptions. One is that the source region 24 shown in FIG. 4 is not present in the workpiece shown in FIG. 9 and, in direct consequence of the absence of such source region, the thickness of the grown oxide layer 60 is quite uniform along the thickness of the P layer 14. At the junction 16 between the layer 12 and the P layer 14, the oxide is also relatively uniformly thick because, as previously explained, the dopant concentrations in the P layer 14 and the N⁻ layer 12 are relatively similar, and the rates of growth of the oxide layers on the two layers are also relatively similar.

Figure 10:
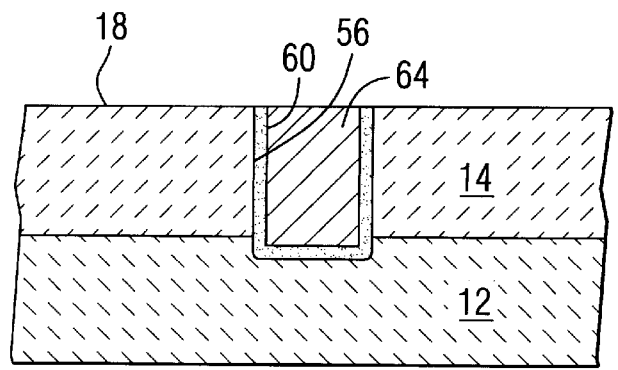
Figure 11:
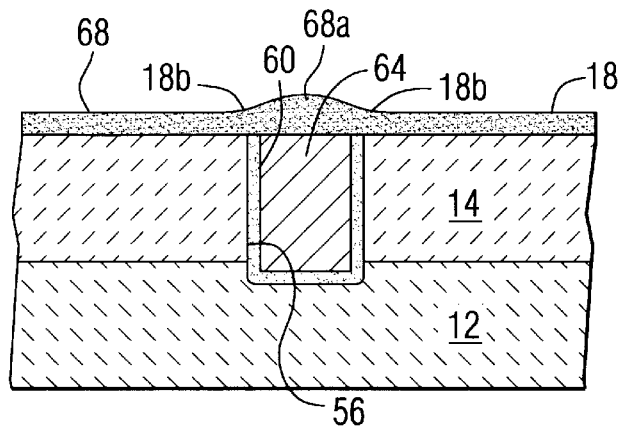
Figure 12:
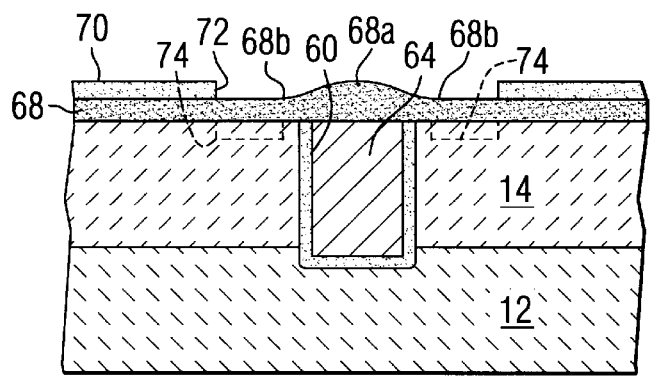

In next steps, the result of which is shown in FIG. 10, a layer of a conductive material, preferably doped polycrystalline silicon, is deposited on the workpiece and of sufficient thickness to completely fill in the trench 56. Using a known process, e.g., the aforementioned "planarizing" process, all the polysilicon material on the workpiece portion illustrated, except the polysilicon 64 within the trench 56, is removed. Any oxide and photoresist layers previously on the workpiece are also removed leaving a clean workpiece upper surface as shown in FIG. 10. Then (FIG. 11), the entire upper surface of the workpiece is thermally oxidized for providing an oxide layer 68 (e.g., of thickness 300–400 A) on the workpiece surface. The oxide layer is formed by the combination of oxygen with the silicon material on which the oxide is formed, and the thickness of the oxide is a function of the rate of oxidation of the silicon. Polycrystalline silicon oxidizes more rapidly (e.g., by a factor of around 3) than the monocrystalline silicon of the layer 14 and more rapidly than the edge of the silicon dioxide layer 60 exposed at the upper surface of the workpiece. Accordingly, the oxide layer 68 includes a thickened "cap" portion 68a. As shown in FIG. 11, the thickness of the oxide cap 68a changes somewhat gradually with the result that the oxide cap 68a has a thickness, e.g., 900–1200 A where it overlies the filled in trench 56, a thickness, e.g., 400–900 A where it overlies the oxide layer 60, and a thickness decreasing to that of the oxide layer 68 where the cap 68a overlies a small portion 18b of the surface 18 of the P layer 14 adjoining the oxide layer 60. In subsequent steps, the result of which is shown in FIG. 12, a photoresist layer 70 is provided on the workpiece and photolithographically patterned to provide an opening 72 therethrough exposing the trench oxide cap 68a and a portion 68b of the surface oxide 68 on the P layer 14 surrounding the oxide cap 68a.

N type dopant ions are then implanted through the opening 72 to form an N doped region 74 (shown in dashed lines in FIG. 12) directly beneath the opening 72. As described, the oxide cap 68a is thicker than the remainder of the oxide layer 68. The N type dopant ions (e.g., phosphorous) are implanted at an energy, e.g., 40–120 KeV, sufficient to penetrate the relatively thin oxide portion 68b and to enter into the P layer 14 but of insufficient energy to penetrate through the oxide cap 68a. Because the edges of the oxide cap 68a extend over and slightly beyond the gate electrode oxide layer 60, no dopants are injected into the oxide layer 60, and the implanted N doped region 74 is spaced slightly away from the oxide layer 60.

Figure 13:
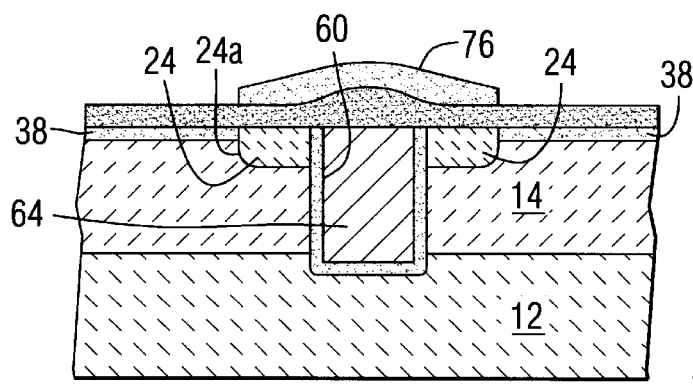

In a subsequent heating process (after removal of the photoresist layer 70), the dopant region 74 is caused to expand into contact with the gate oxide layer 60 to form a source region 24, as shown in FIG. 13. The workpiece shown in FIG. 13 (including a subsequently formed and patterned photoresist layer 76) is similar to the workpiece shown in FIG. 5 (but having straighter and smoother trench side walls and more uniformly thick gate oxide layers 60), and the subsequent steps used to complete the FIG. 5 workpiece can be used to complete the FIG. 13 workpiece.

Figure 14:
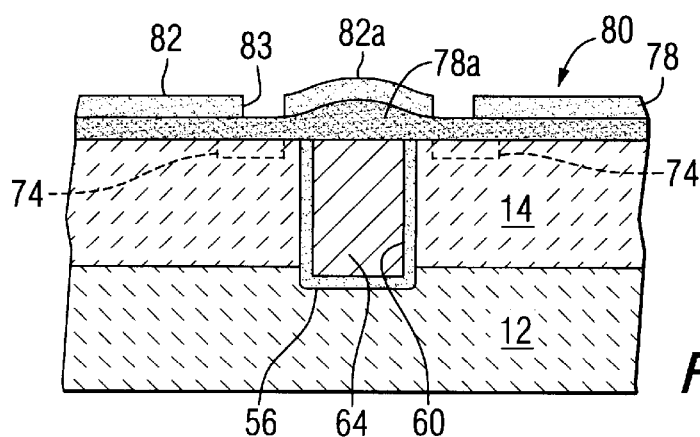
FIG. 14 shows a modification of a process step shown in FIG. 12.

In the first embodiment of the invention illustrated in FIGS. 7–13, an oxide cap 68a (FIG. 12) is used during ion implantation through a patterned photoresist layer 70 for masking the gate electrode 64 and the gate oxide layer 60 against the implanted ions. In a variation from the first embodiment, a workpiece 80 (FIG. 14) is first processed to a configuration as shown in FIG. 10; i.e., a trench 56 has been filled with polysilicon 64 and both the excess silicon deposited during the trench filling step and the previously present (FIG. 9) oxide layer 25 have been removed leaving the surface of the P layer exposed. Then, in a step resulting in the workpiece having an appearance as shown in FIG. 11, an oxide layer 78 (FIG. 14) is grown on the workpiece including an oxide cap 78a, such oxide layer 78 and oxide cap 78a having the appearance and disposition on the workpiece as the layer 68 and the cap 68a shown in FIG. 11. A difference, however, is that the oxide layers 78 and 78a, as shown in FIG. 14, are preferably (but not necessarily) thinner than the oxide layers 68 and 68a shown in FIG. 11 (and in FIG. 12). For example, the oxide layer 78 can have a thickness of around 100–200 A (versus the aforementioned thickness of 300–400 A for the layer 68) and the oxide cap 78a has a thickness (at the thickest portion overlying the polysilicon 64) of, for example, 300–600 A (versus 900–1200 A for the cap 68a). An advantage of the provision of thinner oxide layers 78 and 78a is that the oxidation process used to form the oxide layers 78 and 78a can be at lower temperatures and/or shorter duration than the process used to form the oxide layers 68 and 68a. The oxidation process is thus faster and less expensive. More significant, however, is that the various workpieces shown herein are part of much larger workpieces which can contain (depending on the devices being made) any number of doped regions not illustrated herein. As known, any thermal process used tends to disrupt and change the characteristics of previously formed doped regions. Accordingly, for least disruption of prior formed doped regions of the devices, low temperature processes are generally preferred over higher temperature processes.

With the oxide layers 78 and 78a (FIG. 14) in place, a photoresist layer is deposited on the workpiece surface and patterned to provide the masking layer 82. FIG. 14 is similar to FIG. 12 except that a portion 82a of the photoresist layer 82 overlies the relatively thin oxide cap 78a and adds to the thickness thereof. The combined oxide cap 78a and covering photoresist layer 82a quite effectively protect the gate electrode 64 and gate oxide layer 60 against contamination by ions implanted through an opening 83 through the layer 82 to form an N type region 74 (as in FIG. 12).

A still further advantage of the use of a thinner oxide layer 78 is that lower ion implantation energies can be used for penetrating the relatively thin layer 78. Lower implantation energies result in greater control over the location and concentrations of the implanted ions and reduced ion damage.

Figure 15:
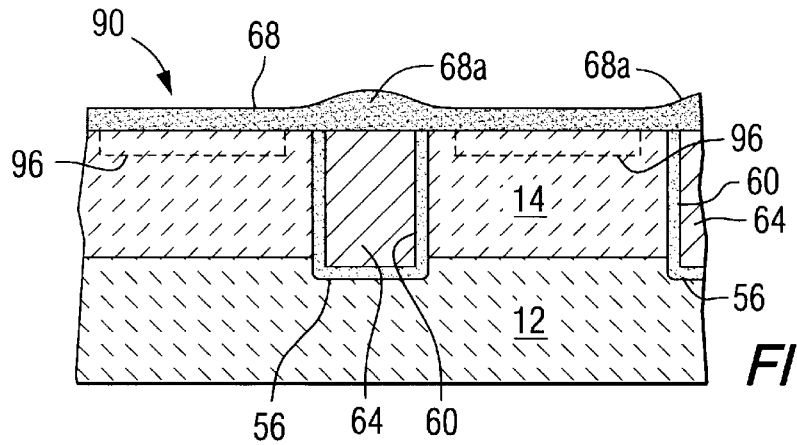

A third embodiment of the invention is shown in FIG. 15. Here, a workpiece 90 has been processed to a condition such as shown in FIG. 12, including a polysilicon gate electrode 64 filling a trench 56 including a gate oxide layer 60, an overlying oxide layer 68 including an oxide cap 68a.

A difference between the workpiece shown in FIG. 12 and the workpiece shown in FIG. 15 is that, in FIG. 12, a masking layer 70 is used during formation of the doped region 74. The opening 72 through the masking layer 70 defines what will become the "outer" edge 24a (FIG. 13) of the source region 24, i.e., the edge of the source region later contacted by the subsequently implanted P$^+$ region 38. In FIG. 15, however, no masking layer similar to the FIG. 12 layer 70 is present. An N dopant implant is still made, however, with the thus implanted region 90 not having an "outer" edge such as the aforementioned outer edge 24a shown in FIG. 13 but extending to an adjacent trench structure as partially shown in FIG. 15. Accordingly, an ion implantation mask, such as the mask 70 shown in FIG. 12, is not used and one photolithographic sequence is entirely eliminated.

The workpiece is then heated for diffusing the implanted ions in the region 96 both downwardly and laterally. The result (FIG. 16) is that the initially implanted region expands into a region 96a contacting the gate oxide layer 60. Although of large lateral extent, the region 96a is to form the transistor N type source region.

Figure 16:
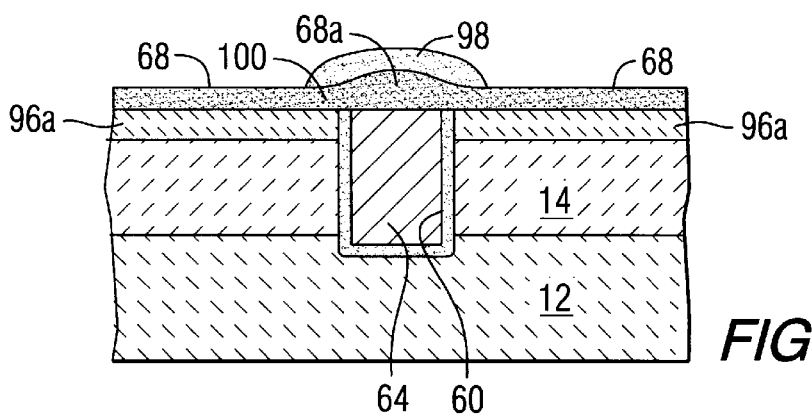

Next, as also shown in FIG. 16, a patterned etchant mask 98 is provided covering the oxide cap 68a and an annular portion 100 of the oxide layer 68 surrounding the cap 68a. Relatively little precision is required in the patterning of the mask 98 because the more critical parameters of the source region 96a, i.e., its depth and its contacting relationship with the gate oxide layer 60, have already been defined and only less critical elements of the device remain to be formed.

Figure 17:
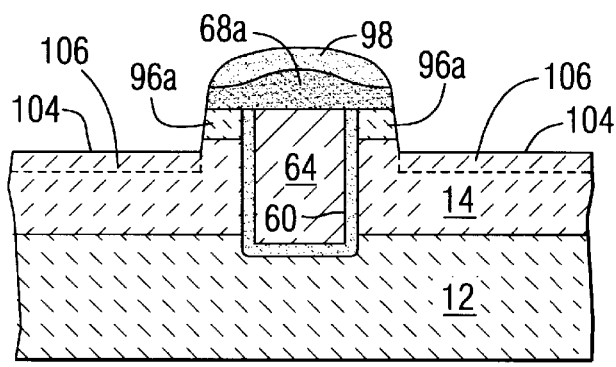

Then, as shown in FIG. 17, surface portions of the workpiece exposed through the etchant mask 98 are etched away using, for example, RIE, to a depth into the P layer 14 greater than the depth of the doped N type region 96a. A central mesa structure is thus provided including a source region 96a surrounding the gate electrode 64 and contacting the gate oxide layer 60.

Figure 18:
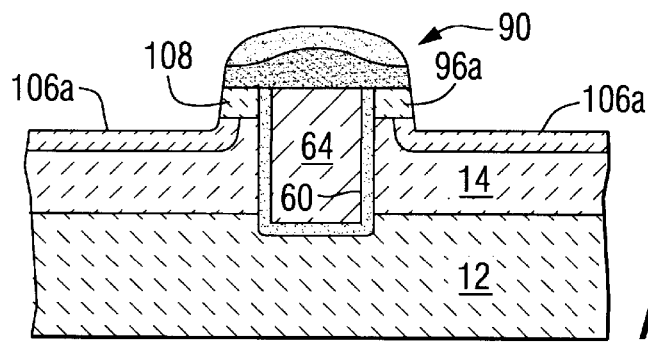

With a new surface 104 of the P layer 14 now exposed, P type ions are implanted (FIG. 17) to form a P$^+$ region 106 which, after a subsequent heating (diffusion) step, is driven laterally to first underlie the source region 96a and then upwardly to partially merge (as shown by region 106a in FIG. 18) with an outer edge portion 108 of the source region 96a spaced from the gate oxide layer 60. At this stage, the workpiece 90, although containing a mesa structure, is basically identical to the workpiece 50 shown in FIG. 13 and can be similarly thereafter processed.

Figure 19:
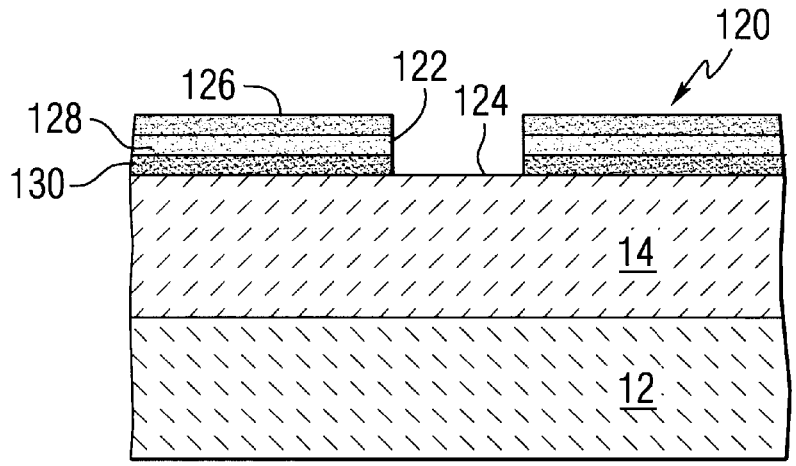

A fourth embodiment of the invention is shown in FIG. 19. Here, a workpiece 120 has been processed similarly as the workpiece 50 shown in FIG. 7 with the exception that an opening 122 exposing a surface portion 124 of the P layer 14 is through a photoresist layer 126, a silicon nitride layer 128 and a silicon dioxide layer 130. Two differences from the workpiece shown in FIG. 7 are present. One is the addition of the silicon nitride layer 128 and the second is that the oxide layer 130 is considerably thinner (e.g., having a thickness of around 200–400 A) than the oxide layer 20 in FIG. 7 (having a thickness of around 2000–4000 A).

Figure 20:
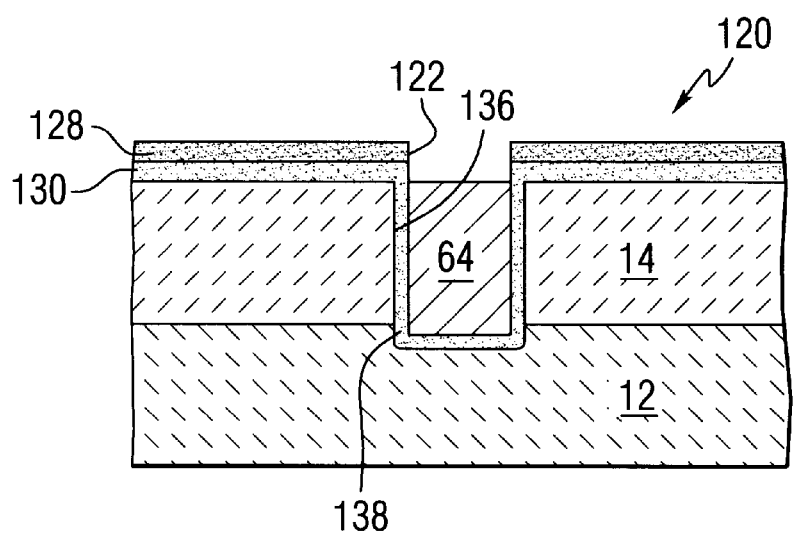

Then, the result of which is shown in FIG. 20, a trench 136 is etched through the P layer 14 and into the N⁻ layer 12, the trench walls are oxidized to form a gate oxide layer 138, the trench is filled with polysilicon 64, and the excess polysilicon is removed. Previously described processes can be used.

Then, and without removing the oxide 130 and nitride 128 layers, the workpiece is thermally oxidized to grow an oxide cap 140 on the polysilicon 64. Because, as shown in FIG. 20, the opening 122 exposes edges of the oxide layer 130 and the gate oxide 138, these edges also grow with the result, shown in FIG. 21, that the variable thickness cap 140 extends slightly beneath the edges 128a of the nitride layer 128.

Figure 21:
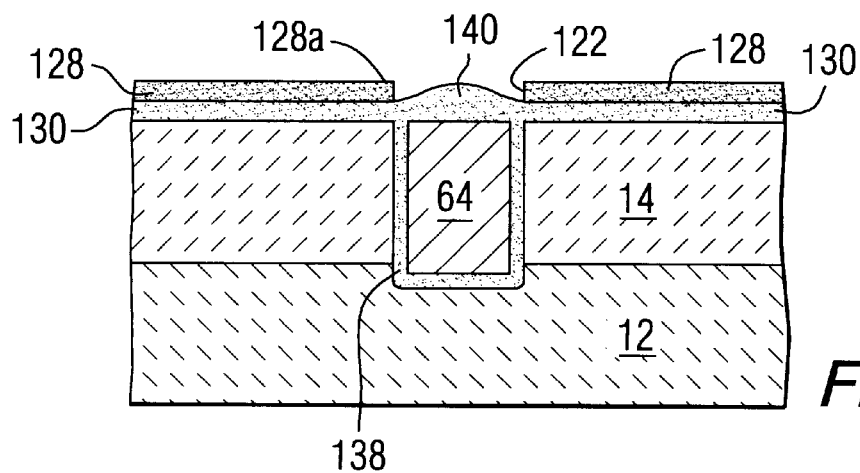

At this point, the workpiece shown in FIG. 21 is somewhat similar to the workpiece shown in FIG. 11. Differences, however, are that, as mentioned, the oxide layer 130 in FIG. 21 is thinner than the oxide layer 68 in FIG. 11. Also, because of the presence of the nitride layer 128 covering the oxide layer 130, the thermal growth process used for growing the oxide cap 140 does not cause an increase in the thickness of the oxide layer 130. The importance of this is hereinafter discussed.

Because the oxide cap 140 is thus grown independently of the oxide layer 130, it can be, and is grown to a relatively great thickness, e.g., a thickness (at the portion of maximum thickness) of around 2,000–3,000 A in comparison with the comparable portion thickness of around 900–1,200 A for the oxide cap 68a shown in FIG. 11.

Figure 22:
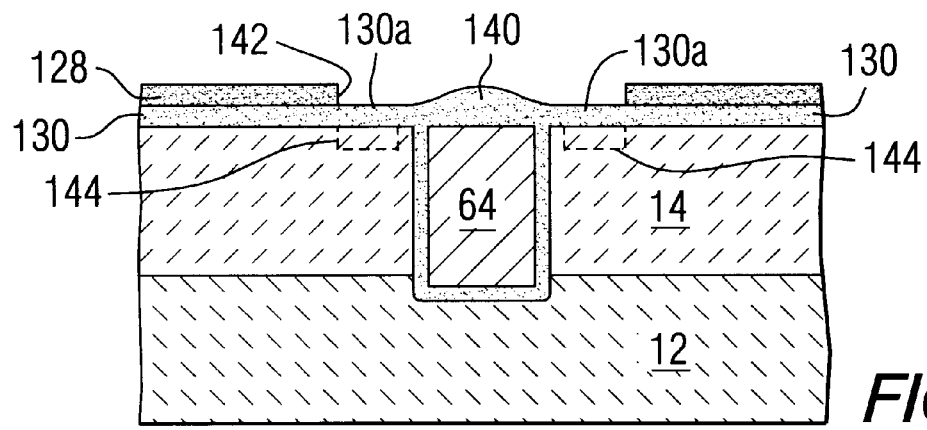

With the extra thick oxide cap 140 in place, the opening 122 through the nitride layer 128 is photolithographically enlarged to the opening 142 shown in FIG. 22. N type dopant ions are then implanted through the opening 142 and through the exposed portions 130a of the oxide layer 130 (but not through the oxide cap 140) to form an N type region 144 basically identical to the N type region 74 formed through the opening 72 in FIG. 12. Differences, however, are that because the oxide layer portion 130a exposed through the window 142 in FIG. 22 is thinner (as described) than the exposed oxide layer portion 68b in FIG. 12, lower energy need be used to penetrate the oxide layer to form the implanted N type region. This allows better control of the doping concentration and of the location of the implanted region and reduced damage to the silicon material. Also, the extra thick oxide cap 140 provides even greater protection against ion implantation into the gate electrode 64 and gate oxide layer 136. Thus, an extra ion masking layer such as the cap masking layer 82a shown in FIG. 14 is not required.

Figure 23:
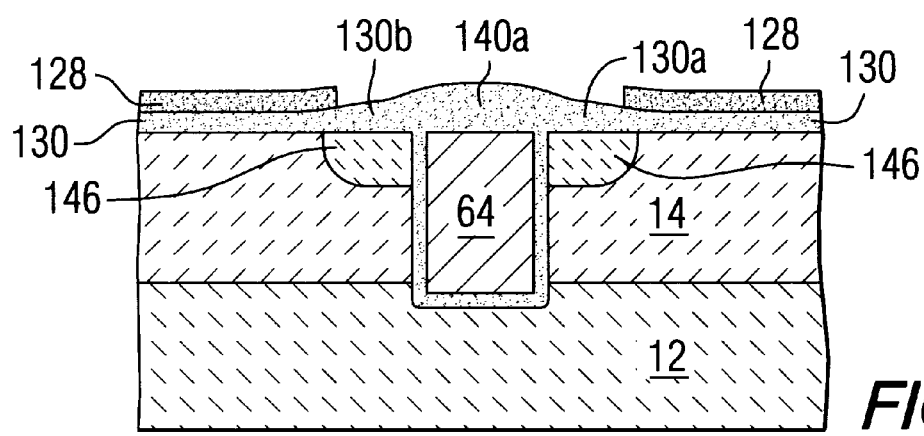

The implanted region 144 shown in FIG. 22 is then diffused to expand into contact with the gate oxide layer 138, as shown in FIG. 23, and to form an N type source region 146.

During the diffusion process, by heating, the portions 130a of the oxide layer 130 (FIG. 22) exposed through the window 142 remain exposed and grow into greater thickness portions 130b (FIG. 23) having a thickness of, for example, around 400–1,000 A (versus the thickness of around 200–400 A of the remaining portions of the oxide layer 130 covered by the nitride layer 128).

Figure 24:
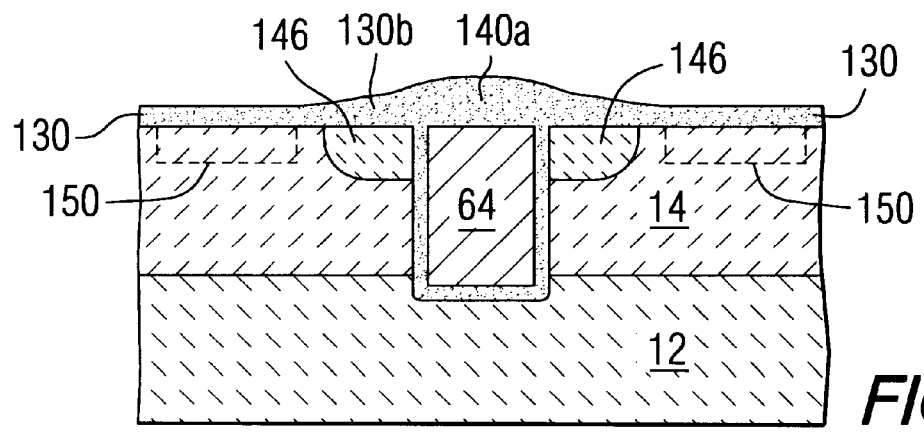

The nitride layer 128 is then removed, as shown in FIG. 24. P type dopant ions are then implanted into the workpiece with energy sufficient to penetrate only the thinnest portion of the oxide layer 130 to form a P⁺ region 150 spaced slightly away from the N source region 146. The P⁺ region 150 is then diffused into contact with the N region 146, thus having the appearance, as in FIG. 13, where the P⁺ region 38 contacts the source region 24.

Two points are noted. One is that, along with the oxide cap 140a shown in FIG. 24, the thickened portions 130b of the oxide layer 130 serve as a mask during the implantation of the P type dopants into the P layer 14 to form the region 150. Thus, a photolithographic step used in the other embodiments, e.g., to define the mask 76 shown in FIG. 13, is not required. This reduces the cost of the process.

The second point relates to the fact that, although not illustrated, at some stage in the processing, the oxide layer 130 must be stripped to expose a surface of the silicon layer 14 for the deposition of a metal electrode thereon. In the process illustrated in FIGS. 19–24, because the original oxide layer 130 (FIG. 19) is protected by the silicon nitride layer 128, the oxide layer 130 remains relatively pure and uncontaminated and thus can be quite easily stripped. The result of this is that upon stripping of the oxide layer 130, the surface of the P layer 14 thus exposed is quite clean and not contaminated by the process used for stripping the oxide layer, and the metal electrode deposition step can be immediately performed without further cleaning or surface preparation processes. This is desirable as further simplifying the processing leading to reduced costs and higher yield.

In the foregoing description, several embodiments of the invention are described. While some of the modifications are described as providing certain advantages, the actual process preferred in any given situation is a function of the actual device being made and the availability of various processing apparatus suitable for performing the different modifications described. Also, because the various modifications described make use of known processes, persons of skill will have no difficulty selecting those modifications which best match the device being made and with which they are most comfortable.

Silicon is the presently preferred semiconductor material. Likewise, silicon dioxide is the presently preferred dielectric material used for the gate oxide and various masking layers. Other dielectric materials can be used, for example, "oxynitride" (silicon dioxide plus silicon nitride) or tantalum oxide. Similarly, while doped polycrystalline silicon is the preferred gate electrode material, silicides of tungsten, cobalt or titanium can be used.

What is claimed is:

1. A method of fabricating an MOS device within a body of semiconductor material including a first layer having a first surface and a first electrical conductivity, and being of a first conductivity type, and a second layer forming an interface with said first surface, said second layer having a second conductivity greater than that of said first layer and being of a second conductivity type, the method comprising the steps of etching a trench entirely through said second layer starting from a first surface thereof opposite to said interface and extending through said interface and into said first layer, said trench having a continuous wall comprised of exposed surfaces of said first and second layers, forming a dielectric material third layer on said wall covering at least portions of said exposed surfaces including the interface therebetween, then filling said trench, and covering said dielectric material layer, with doped polysilicon, then introducing first dopants into said second layer for converting a first region of said second layer to a conductivity of said first type and of a third conductivity greater than said second conductivity of said second layer, said first region being contiguous with a portion of the trench wall contiguous with said dielectric material layer covered, in turn, with said doped polysilicon, said first region being spaced, within said second layer, from said interface between said first and second layers, and wherein, after said trench filling step, thermally growing a silicon dioxide fourth layer on exposed surfaces of said body, said fourth layer including: a) first portions overlying portions of said opposite surface of said second layer surrounding said trench, said first portions being spaced from said trench by a gap; b) a second portion on the surface of the polysilicon within said trench; and c) third portions overlying said third layer and filling said gap, said second and third portions being thicker than said first portion, and said dopant introducing step comprises ion implanting the dopants with an energy high enough for passing through said first portions of said fourth layer but insufficient for passing through said second and third portions of said fourth layer; and, prior to said dopant introducing step, providing a first ion mask having an opening exposing said first portion of said fourth layer while covering said second and third portions of said fourth layer.

2. A method of fabricating an MOS device within a body of semiconductor material including a first layer having a first surface and a first electrical conductivity, and being of a first conductivity type, and a second layer forming an interface with said first surface, said second layer having a second conductivity greater than that of said first layer and being of a second conductivity type, the method comprising the steps of etching a trench entirely through said second layer starting from a first surface thereof opposite to said interface and extending through said interface and into said first layer, said trench having a continuous wall comprised of exposed surfaces of said first and second layers, forming a dielectric material third layer on said wall covering at least portions of said exposed surfaces including the interface therebetween, then filling said trench, and covering said dielectric material layer, with doped polysilicon, and then introducing first dopants into said second layer for converting a first region of said second layer to a conductivity of said first type and of a third conductivity greater than said second conductivity of said second layer, said first region being contiguous with a portion of the trench wall contiguous with said dielectric material layer covered, in turn, with said doped polysilicon, said first region being spaced, within said second layer, from said interface between said first and second layers, and wherein, after said trench filling step, thermally growing a silicon dioxide fourth layer on exposed surfaces of said body, said fourth layer including first portions overlying portions of said opposite surface of said second layer surrounding said trench, said first portions being spaced from said trench by a gap, a second portion on the surface of the polysilicon within said trench, and third portions overlying said third layer an filling said gap, said second and third portions being thicker than said first portion, and said dopant introducing step comprises ion implanting the dopants with an energy high enough for passing through said first portions of said fourth layer but insufficient for passing through said second and third portions of said fourth layer; and, after said dopant introducing step, providing a first ion mask covering said second and third portions of said fourth layer and a first length of said first portion of said fourth layer contiguous with said third portion, said ion mask exposing a second length of said fourth layer first portion overlying a portion of said first region spaced from said trench, etching into said second layer through the portion thereof exposed by said ion mask for a depth greater than the depth of said first region for exposing a second surface of said second layer, and introducing second dopants into said second layer through said second surface for forming a second region of said second type conductivity, said second region having a fourth conductivity greater than said second conductivity of said second layer and being contiguous with said first region.

3. A method of fabricating an MOS device within a body of semiconductor material including a first layer having a first surface and a first electrical conductivity, and being of a first conductivity type, and a second layer forming an interface with said first surface, said second layer having a second conductivity greater than that of said first layer and being of a second conductivity type, the method comprising the steps of etching a trench entirely through said second layer starting from a first surface thereof opposite to said interface and extending through said interface and into said first layer, said trench having a continuous wall comprised of exposed surfaces of said first and second layers, forming a dielectric material third layer on said wall covering at least portions of said exposed surfaces including the interface therebetween, then filling said trench, and covering said dielectric material layer, with doped polysilicon, and then introducing first dopants into said second layer for converting a first region of said second layer to a conductivity of said first type and of a third conductivity greater than said second conductivity of said second layer, said first region being contiguous with a portion of the trench wall contiguous with said dielectric material layer covered, in turn, with said doped polysilicon, said first region being spaced, within said second layer, from said interface between said first and second layers, and wherein, after said trench filling step, thermally growing a silicon dioxide fourth layer on exposed surfaces of said body, said fourth layer including first portions overlying portions of said opposite surface of said second layer surrounding said trench, said first portion being spaced from said trench by a gap, a second portion on the surface of the polysilicon within said trench, and third portions overlying said third layer and filling said gap, said second and third portions being thicker than said first portion, and said dopant introducing step comprises ion implanting the dopants with an energy high enough for passing through said first portions of said fourth layer but insufficient for passing through said second and third portions of said fourth layer; and, prior to said dopant introducing step, providing a first ion mask having an opening exposing said first portion of said fourth layer while covering said second and third portions of said fourth layer; and, after said first dopant introducing step, increasing the thickness of said first, second and third portions of said fourth layer exposed through said ion mask, then removing said ion mask for exposing fourth portions of said fourth layer contiguous with said third portion and having a thickness less than said first, second and third portions of said fourth layer, and ion implanting second dopants with an energy high enough for penetrating only through said fourth layer fourth portion for forming a second region within said second layer of said second type conductivity, said second region being of a conductivity greater than said second conductivity of said second layer and being contiguous with said first region.

4. A method according to claim 3 wherein said first ion mask comprises silicon nitride.

5. A method of fabricating an MOS device comprising providing a body of semiconductor material having a trench extending into a first surface of the body, said trench having side walls covered with a first oxide layer terminating in a second surface at said body surface, and said trench being filled with a layer of polysilicon having a third surface at said body surface, thermally growing a second oxide layer with a first thickness on said body first surface and with respectively greater thicknesses on said second and third surfaces, providing an ion mask on said body having an opening exposing a portion of said second oxide layer of said first thickness while covering portions of said second oxide layer of said greater thickness on said second and third surfaces immediately adjoining said exposed portion, and then ion implanting dopants into said body at an energy sufficient only for penetrating said exposed portion of said second oxide layer.

6. A method of fabricating an MOS device comprising providing a body of semiconductor material having a trench extending into a first surface of the body, said trench having side walls covered with a first oxide layer terminating in a second surface at said body surface, and said trench being filled with a layer of polysilicon having a third surface at said body surface, thermally growing a second oxide layer with a first thickness on said body first surface and with respectively greater thicknesses on said second and third surfaces, ion implanting dopants into said body at an energy sufficient only for penetrating said first thickness of said second oxide layer for forming a first doped region within said body at said first surface encircling and contiguous with a portion of said trench having a first depth from said first surface, selectively etching into said first surface through and beyond said first doped region for forming a mesa structure comprising a portion of said trench encircled by said first region, and introducing dopants into said body through said etched portion thereof for forming a second doped region encircling and contiguous with a peripheral portion of said first doped region spaced from said trench.

7. A method of fabricating an MOS device comprising providing a body of semiconductor material having a trench extending into a first surface of the body, said trench having side walls covered with a first oxide layer terminating in a second surface at said body surface, and said trench being filled with a layer of polysilicon having a third surface at said body surface, thermally growing a second oxide layer with a first thickness on said body first surface and with respectively greater thicknesses on said second and third surfaces, providing an ion mask on said body having an opening exposing a first portion of said second oxide layer on said second and third surfaces and a second portion of said second oxide layer of said first thickness immediately adjoining said first portion, ion implanting first dopants into said body at an energy sufficient only for penetrating said second portion of said second oxide layer for forming a first doped region within said body at said first surface encircling and contiguous with a portion of said trench at said first surface, then increasing the thickness of said second oxide layer portions exposed through said ion mask while not increasing the thickness of a third portion of said second oxide layer covered by said ion mask, then removing said ion mask and ion implanting second dopants into said body at an energy sufficient only for penetrating said third portion of said second oxide layer for forming a second dopant region encircling and contiguous with a peripheral portion of said first doped region spaced from said trench.

* * * * *